United States Patent
Sanders

(10) Patent No.: US 7,272,542 B1
(45) Date of Patent: Sep. 18, 2007

(54) METHOD AND SYSTEM FOR RE-TARGETING INTEGRATED CIRCUITS

(75) Inventor: Lester S. Sanders, Albuquerque, NM (US)

(73) Assignee: Xilinx, Inc., San Jose, CA (US)

( * ) Notice: Subject to any disclaimer, the term of this patent is extended or adjusted under 35 U.S.C. 154(b) by 693 days.

(21) Appl. No.: 09/847,032

(22) Filed: Apr. 30, 2001

(51) Int. Cl.
G06F 17/50 (2006.01)
G06F 5/00 (2006.01)

(52) U.S. Cl. .................... 703/2; 703/14; 716/2; 716/16

(58) Field of Classification Search ............... 703/20, 703/25, 13, 2, 14, 22, 1; 716/3, 4, 7, 8, 5, 716/16, 2
See application file for complete search history.

(56) References Cited

U.S. PATENT DOCUMENTS

| | | | | |
|---|---|---|---|---|
| 5,452,227 A * | 9/1995 | Kelsey et al. | .................... | 716/3 |
| 5,659,484 A * | 8/1997 | Bennett et al. | ................ | 716/16 |
| 5,673,198 A * | 9/1997 | Lawman et al. | ............... | 716/11 |
| 6,035,106 A * | 3/2000 | Carruthers et al. | ............. | 703/1 |
| 6,044,211 A * | 3/2000 | Jain | ........................... | 716/18 |
| 6,086,625 A * | 7/2000 | Shouen | .......................... | 716/1 |
| 6,135,647 A * | 10/2000 | Balakrishnan et al. | ......... | 716/18 |
| 6,205,574 B1 * | 3/2001 | Dellinger et al. | ............. | 716/16 |
| 6,216,257 B1 * | 4/2001 | Agrawal et al. | .............. | 716/16 |
| 6,216,259 B1 * | 4/2001 | Guccione et al. | ............. | 716/17 |
| 6,226,776 B1 * | 5/2001 | Panchul et al. | ................ | 716/3 |
| 6,243,851 B1 * | 6/2001 | Hwang et al. | ................ | 716/10 |
| 6,493,648 B1 * | 12/2002 | Anderson | ................... | 702/119 |
| 6,519,755 B1 * | 2/2003 | Anderson | .................... | 716/18 |
| 6,691,078 B1 * | 2/2004 | Beer et al. | .................... | 703/14 |
| 6,691,301 B2 * | 2/2004 | Bowen | ....................... | 717/114 |
| 6,763,506 B1 * | 7/2004 | Betz et al. | ..................... | 716/6 |
| 7,133,819 B1 * | 11/2006 | Hutton | ........................ | 703/19 |
| 2002/0069396 A1 * | 6/2002 | Bhattacharya et al. | ......... | 716/7 |
| 2002/0100001 A1 * | 7/2002 | Lai et al. | ....................... | 716/1 |
| 2003/0216901 A1 * | 11/2003 | Schaumont et al. | | |

* cited by examiner

*Primary Examiner*—Thai Phan
(74) *Attorney, Agent, or Firm*—H. C. Chan; LeRoy D. Maunu

(57) ABSTRACT

The present invention allows a designer to easily re-target the design optimized for the device of one integrated circuit vendor to the device of another vendor. The designer can start with a set of post-routed boolean equations optimized for a certain target integrated circuit. The present invention allows the automatic generation of a synthesizable, editable, and simulatable HDL description. The designer may edit the HDL code. Another target may be selected. Design optimization and placement and routing can be performed for the new target.

25 Claims, 18 Drawing Sheets

Equations

SUBDESIGN 'counter4'
(
    clk                    : INPUT;
    rst                    : INPUT;
    count0             : OUTPUT;
    count1             : OUTPUT;
    count2             : OUTPUT;
    count3             : OUTPUT;
)

VARIABLE

_EQ001              : NODE;
    _EQ002              : NODE;

BEGIN count0 = TFFE( VCC, GLOBAL( clk), !rst, VCC, VCC);

count1 = TFFE( count0, GLOBAL( clk), !rst, VCC, VCC);

count2 = TFFE( _EQ001, GLOBAL( clk), !rst, VCC, VCC);
 _EQ001 = count0 & count1;

count3 = TFFE( _EQ002, GLOBAL( clk), !rst, VCC, VCC);
 _EQ002 = count0 & count1 & count2;

END;

Fig. 8A

```
-- Design name: counter4

-- Design Statistics
-- Number of Inputs       : 2
-- Number of Outs/Inouts  : 4
-- Number of TFFEs        : 4
-- Number of EQ Equations : 2 library ieee;
use ieee.std_logic_1164.all;

entity tffe is
port (q : inout std_logic;
      t : in std_logic;
      clk : in std_logic;
      rst : in std_logic;
      pre : in std_logic;
      ce : in std_logic
);
end tffe;

architecture v1 of tffe is
signal d: std_logic;
begin process (rst,pre,clk)
begin
if rst = '0' then
q <= '0';
elsif pre = '0' then
q <= '1';
elsif clk'event and clk = '1' then
if ce = '1' then
q <= d ;
end if ;
end if ;
end process ;

d <= t xor q;

end v1;

library ieee;
use ieee.std_logic_1164.all;
```

Fig. 8B-1

```vhdl
entity counter4 is
port (
clk : in std_logic;
rst : in std_logic;
count0 : inout std_logic;
count1 : inout std_logic;
count2 : inout std_logic;
count3 : inout std_logic);
end counter4 ;

architecture conversion of  counter4 is component tffe
port (q : inout std_logic;
      t : in std_logic;
      clk : in std_logic;
      rst : in std_logic;
      pre : in std_logic;
      ce : in std_logic
);
end component;

signal EQ001 : std_logic;
signal EQ002 : std_logic;

begin

-- 4 TFFE tffe0 : tffe port map (count0,'1',clk,not  rst,'1','1');
tffe1 : tffe port map (count1,count0,clk,not  rst,'1','1');
tffe2 : tffe port map (count2,EQ001,clk,not  rst,'1','1');
tffe3 : tffe port map (count3,EQ002,clk,not  rst,'1','1');

-- 2 Comb Eqns(s)

EQ001 <= (count0 and  count1);
EQ002 <= (count0 and  count1 and  count2);

-- 0 X Comb Eqn(s)

-- Additional Combinatorial Eqns

-- Assignments for equations w active low LHS end conversion;
```

Fig. 8B-2

```
/* Design statistics

Number of Inputs       : 2
    Number of Outputs      : 4
    Number of TFFEs        : 4
    Number of EQ Equations : 2
*/ module dffe (q,d,clk,rst,pre,ce);
output q;
input d,clk,rst,pre,ce;
reg q;

always @(posedge clk or negedge rst or negedge pre)
begin
if (~rst)
q = 1'b0;
else if (~pre)
q = 1'b1;
else if (ce)
q = d;
end endmodule module tffe (q,t,clk,rst,pre,ce);
output q;
input t,clk,rst,pre,ce;
wire d;

dffe dffe0 (q,d,clk,rst,pre,ce);

assign d = t ^ q;

endmodule
```

Fig. 8C-1

```
module counter4 (
    clk,
    rst,
    count0,
    count1,
    count2,
    count3);

// 2 Inputs input clk;
input rst;

// 4 Outputs output count0;
output count1;
output count2;
output count3;

// 0 reg statements

// 1  wire statements wire _EQ001;
wire _EQ002;

// 4   TFFE tffe tffe0 (count0,1'b1,clk,!rst,1'b1,1'b1);
tffe tffe1 (count1,count0,clk,!rst,1'b1,1'b1);
tffe tffe2 (count2,_EQ001,clk,!rst,1'b1,1'b1);
tffe tffe3 (count3,_EQ002,clk,!rst,1'b1,1'b1);

// 2 Comb Eqns(s)

assign _EQ001 = count0 &  count1;
assign _EQ002 = count0 &  count1 &  count2;

// 0 _X Comb Eqns(s)

endmodule
```

Fig. 8C-2

```
" Conversion of counter4.tdo to counter4.abl clk             pin;
    rst             pin;
    count0          pin;
    count1          pin;
    count2          pin;
    count3          pin;

_EQ001          NODE;
    _EQ002          NODE;

equations count0.t = 1 ;
count0.clk = ( clk) ;
count0.ar = !!rst ;
"count0.ap = 1 ;
"count0.ce = 1 ;

count1.t = count0 ;
count1.clk = ( clk) ;
count1.ar = !!rst ;
"count1.ap = 1 ;
"count1.ce = 1 ;

count2.t = _EQ001 ;
count2.clk = ( clk) ;
count2.ar = !!rst ;
"count2.ap = 1 ;
"count2.ce = 1 ;
  _EQ001 =   count0 &  count1;

count3.t = _EQ002 ;
count3.clk = ( clk) ;
count3.ar = !!rst ;
"count3.ap = 1 ;
"count3.ce = 1 ;
  _EQ002 =   count0 &  count1 &  count2;

END;
```

Fig. 8D

METHOD AND SYSTEM FOR RE-TARGETING INTEGRATED CIRCUITS

FIELD OF THE INVENTION

The invention relates generally to the field of electronic design automation systems for digital logic, and more particularly to a method and system for allowing a designer to re-target integrated circuit of different vendors from a set of post routed boolean equations targeted to an integrated circuit of one vendor.

BACKGROUND OF THE INVENTION

Due to advancements in processing technology, it is now possible to pack millions of transistors in an integrated circuit (IC). As a result, very large and complex circuits can be implemented into an IC. This means that it is extremely difficult for a design engineer to design ICs manually. Currently, almost all design engineers use a broad range of software tools to generate and analyze models of an intended system prior to its fabrication. These tools support the efficient generation of circuit implementation details from abstract specification models. They are also able to detect design mistakes early in the design process, thereby reducing unnecessary efforts spent on erroneous designs. These tools contribute to great savings in time and money needed to develop ICs.

During the early development of electronic design automation, designers define the various modules of an IC at the gate level using a schematic capture and/or simple Hardware Description Language (HDL) technique. Evolution of HDLs and advances in simulation and synthesis technologies have enabled IC designers to design at a higher level (register transfer level, or RTL) than at the gate level.

When designing using a HDL, the designer describes a module in terms of signals that are generated and propagated through combinatorial modules from one set of registers to another set of registers. HDLs provide a rich set of constructs to describe the functionality of a module. HDLs allows designs to be described at different levels. At a high level, the functionality is described using high level constructs such as ALWAYS blocks with sensitivity list, IF statements, CASE statements, and procedural continuous assignment statements that use logic operators, arithmetic operators, and relational operators. For example, Verilog and VHDL allow designs to be described at the behavioral, register transfer, and at the gate level. Similarly, ABEL allows designs to be described at the register transfer level (RTL) and at the structural level. There are a number of HDLs in addition to Verilog, VHDL, and ABEL. Some are proprietary to a single commercial vendor. A more detailed description of Verilog is set forth in Thomas and Moorby, "The Verilog Hardware Description Language," Kluwer Academic Publishers (1990). A more detailed description of VHDL is set forth in K. C. Chang, "Digital Design and Modeling with VHDL and Synthesis," IEEE Computer Society Press (1997). A more detailed description of ABEL is set forth in "ABEL-HDL Reference," Data I/O Corporation (1994).

After a HDL design is defined, the designer uses design software supplied by an IC vendor to optimize the design entry source and then place and route the design into that vendor's target IC. The design software also generates a set of optimized and post-routed low level boolean equations which represent the design functionality. These equations may be hardware dependent or independent. The equations are not written in a standard HDL, such as Verilog or VHDL. Instead, they are generally written using a proprietary language format of the vendor.

FIG. 1 is a diagram that summarizes the above-described prior art electronic design system. A chip designer generally defines a design using VHDL 32, Verilog 34, schematic 36 or mixed schematic/HDL 38. The design is then run through a design software 40 to target a specific device, generally a CPLD (complex programmable logic device), FPGA (field programmable gate array), gate array, standard cell based ASIC, or a standard custom designed integrate circuit product. Conventionally, this software reads the design entry source code (e.g., VHDL, Verilog, or schematics), optimizes the logic, and does place and route on the design. This design software can generate either vendor dependent or vendor independent set of boolean equations 42 into a file.

In the programmable logic device (PLD) industry, some design software supplied by a first PLD vendor can read low-level boolean equations written by the software of a second vendor, and then compile the equations to target devices of the first vendor. This is generally done to allow a designer who has originally targeted his/her design to the technology of the second vendor the ability to re-target the same design into a technology supported by the first vendor. One of the problems is that when designs are re-targeted from one vendor to another using this method, the designer cannot read the intermediate files generated by the design software, edit the design, or simulate the design.

Mixed schematic/HDL designs present additional difficulties. They contain top level schematics having user-defined block symbols for the HDL modules only. Typically, the schematics are vendor dependent, and are written using a proprietary schematic editor and proprietary symbol library of a vendor. As a result, they cannot be re-targeted to another family of ICs marketed by another vendor.

SUMMARY OF THE INVENTION

The present invention provides a novel method and system of electronic design. It allows a designer to easily re-target a design optimized for the device of one IC vendor to the device of another vendor. The designer can start with a set of post-routed boolean equations optimized for a certain target. A corresponding synthesizable, editable, and simulatable HDL description is generated. The designer may edit the HDL code. Another target may be selected. Design optimization and placement and routing can be performed for the new target.

To implement the present invention, a system for automatically generating a HDL description of a design from low-level boolean equations is provided. This HDL description is synthesizable, editable, and simulatable. The designer is no longer required to manually re-write the design into HDL code.

The above summary of the present invention is not intended to describe each disclosed embodiment of the present invention. The figures and detailed description that follow provide additional example embodiments and aspects of the present invention.

BRIEF DESCRIPTION OF THE DRAWINGS

FIG. 8A is an example of a 4-bit counter described using logic equations in according with the present invention.

FIGS. 8B-1 and 8B-2, in combination, show VHDL code corresponding to the 4-bit counter of FIG. 8A.

FIGS. 8C-1 and 8C-2, in combination, show Verilog code corresponding to the 4-bit counter of FIG. 8A.

FIG. 8D shows ABEL code corresponding to the 4-bit counter of FIG. 8A.

DETAILED DESCRIPTION OF THE PREFERRED EMBODIMENTS

The present invention relates to an innovative method to generate high-level hardware description language code. In the following description, numerous specific details are set forth in order to provide a more thorough understanding of the present invention. However, it will be apparent to one skilled in the art that the present invention may be practiced without these specific details. In other instances, well-known features have not been described in detail in order to avoid obscuring the present invention.

As explained above, many designers prefer to work with high level techniques (such as HDL) in designing ICs. The scope of describing designs in HDL is quite large, and a rich set of constructs and functionalities are available to describe any design. However, only a subset of these constructs are synthesizable. That is, only a subset of all of the available constructs can be taken through automated synthesis tools (such as the Design Compiler that is commercially available from Synopsys, Mountain View, Calif.) to generate gate level netlist in terms of the cells from a target technology library provided by the semiconductor vendor. This limited set of synthesizable constructs is referred to herein as synthesizable set, and members of this set is called synthesizable objects.

Many designers like to work with synthesizable HDL constructs that can be easily targeted to ICs of different vendors. One aspect of the present invention is that it is able to identify the synthesizable objects in a set of boolean equations and translates them into synthesizable, editable, and simulatable HDL constructs. With the present invention, the designer does not need to know the syntax of the boolean equations to understand the functionality of the design.

Figure 2:
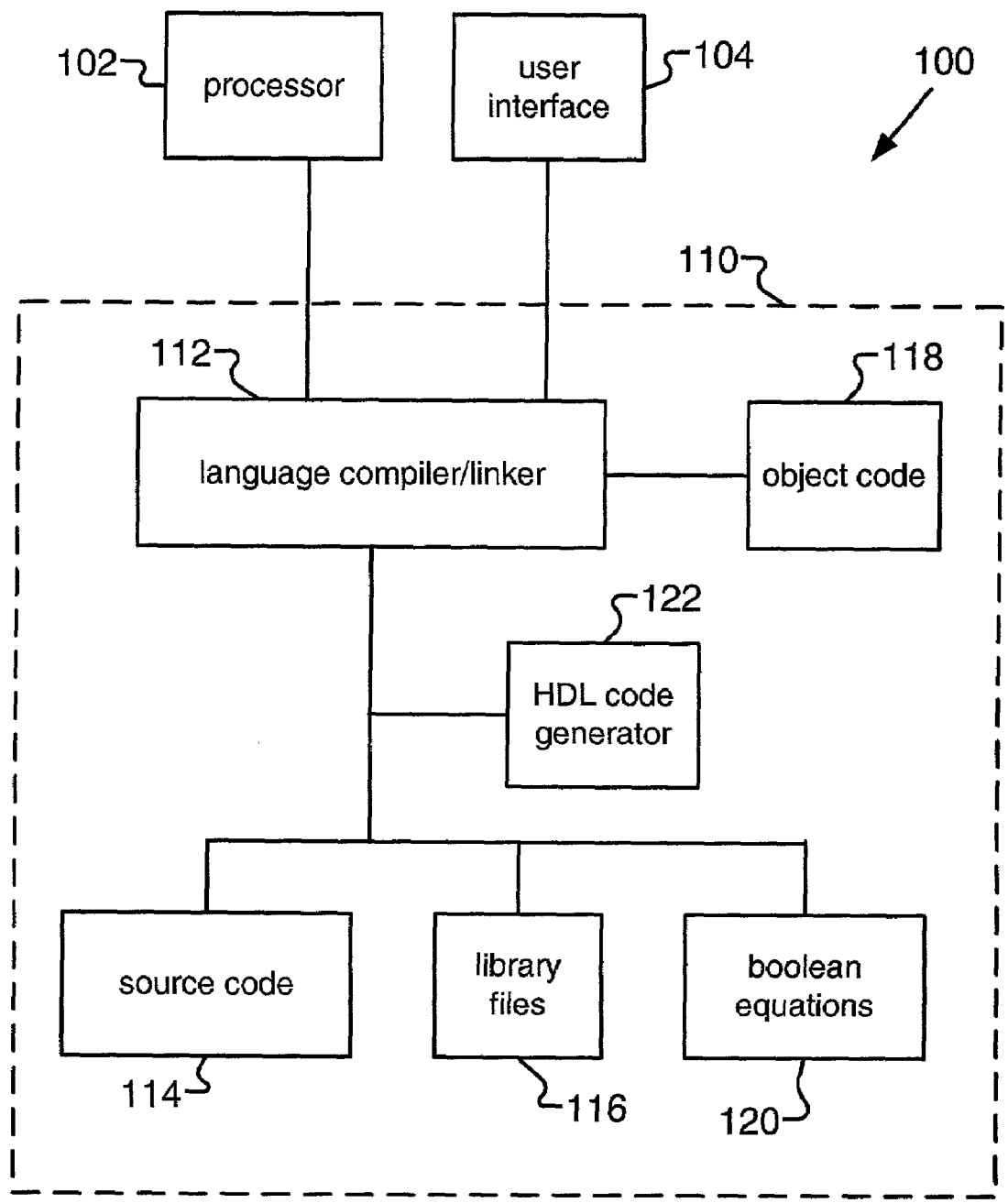
FIG. 2 is a block diagram showing a development environment of the present invention.

The present invention operates in a development environment 100 as shown in FIG. 2. Environment 100 contains a computer system that includes a conventional processor 102, a user interface 104, and memory 110. In the preferred embodiment, a combination of non-volatile memory (such as hard disk) and volatile memory (such as semiconductor random access memory) are used. Memory 110 is used to store a plurality of software modules, such as a language compiler/linker 112, source code (generated by the user) 114, library files 116, object code 118, boolean equations 120 and a synthesizable and simulatable HDL code generator 122. Note that not all of these modules need to be present simultaneously. Language compiler/linker 112 and library files 116 may be conventional software packages that are readily available from various vendors, such as Sun Microsystems, Mountain View, Calif., and Free Software Foundation, Boston, Mass. (which distributes the GNU software).

In one embodiment, the processor of FIG. 2 is a microprocessor of a UNIX workstation. A graphical user interface, such as X-windows, from the Massachusetts Institute of Technology, is used as the user interface. Alternatively, a system based on the so-called "X-86" architecture and the Microsoft Windows operating system (including Windows 95, Windows 98, Windows 2000, and Windows NT) may be used. Software in memory 120 may be written in standard programming language, such as C++ and/or PERL.

Figure 3:
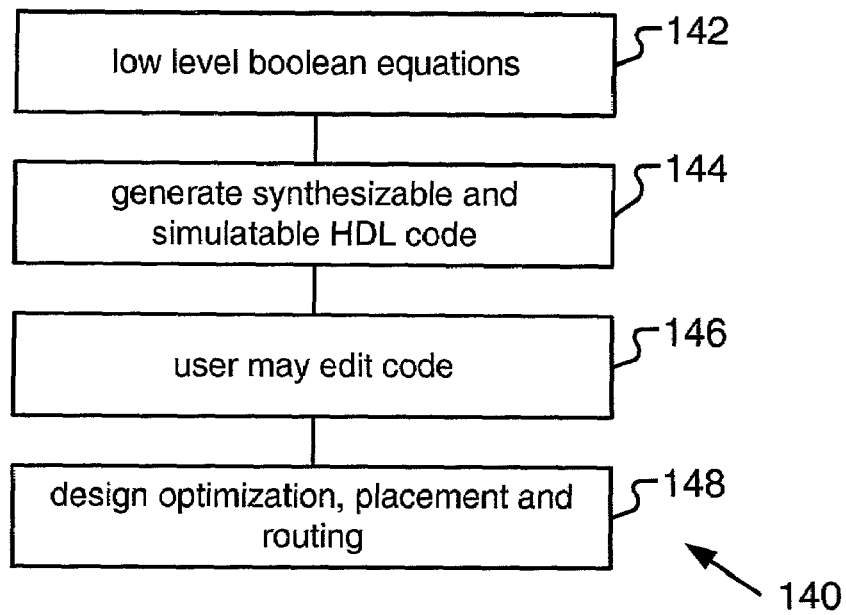
FIG. 3 is a flow chart showing a procedure of the present invention.

The present invention provides a procedure of electronic design that is different from the prior art. FIG. 3 shows a procedure 140 of the present invention. It starts with a set of low level boolean equations (step 142). The boolean equations typically represent inputs, outputs, inouts, logic expressions, relational expressions, arithmetic expression, tristates, and registers. Based on this set of equations, a synthesizable, editable, and simulatable HDL source code is generated (step 144). The user may edit the code (step 146). Design optimization and placement and routing can be performed for a target IC selected by the user (step 148). A different set of low level boolean equations may be generated as a result of step 148.

Figure 4:
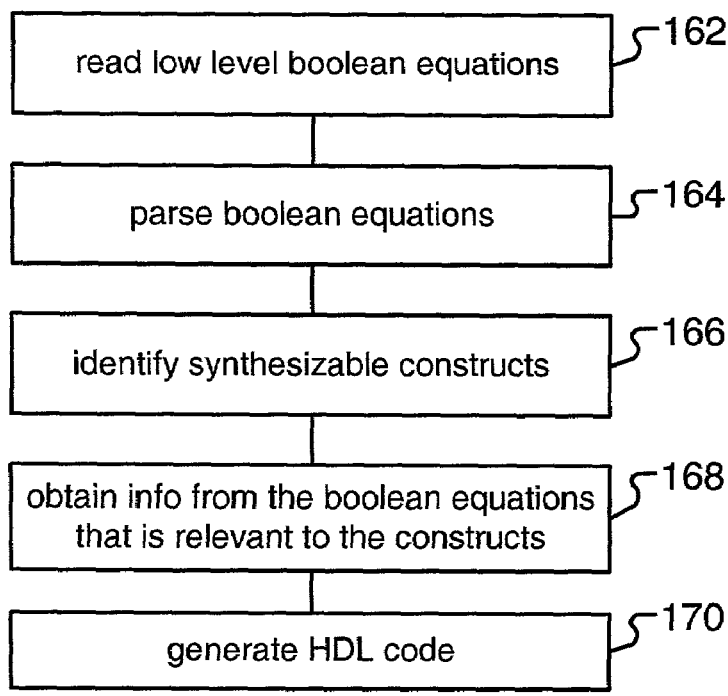
FIG. 4 is a flow chart showing the steps of generating HDL code of the present invention.

The details of step 144 are shown in FIG. 4. In step 162, the low-level boolean equations are read into temporary storage (e.g., in volatile memory). In step 164, the equations are carefully parsed. In step 166, equations that give rise to synthesizable objects are identified. In step 168, information that is relevant to the synthesizable objects is obtained from the boolean equations. In step 170, the corresponding HDL code is generated.

Figure 5A:
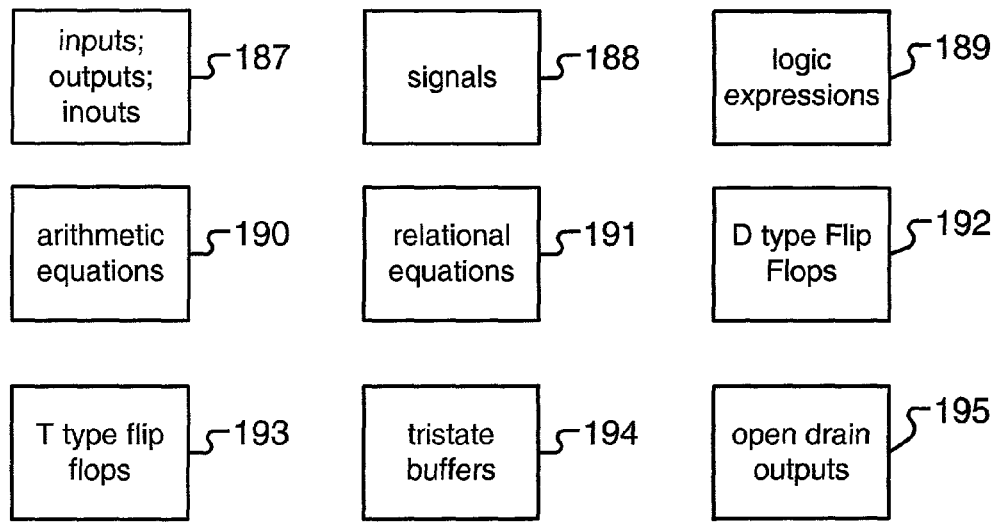
FIG. 5A shows various entities of low level boolean equations that can be used in the present invention.

FIG. 5A is a diagram showing various entities that may be present in boolean equations. The objects are a set of boolean functions commonly used in digital design. This set of boolean functions include signals 188, inputs, outputs, inouts (shown as 187), logic expressions 189, arithmetic equations 190, relational equations 191, registers, tristate buffers 194, and open drain outputs 195. The register elements include various forms of D flip flops 192 and T flip flops 193.

Figure 5B:
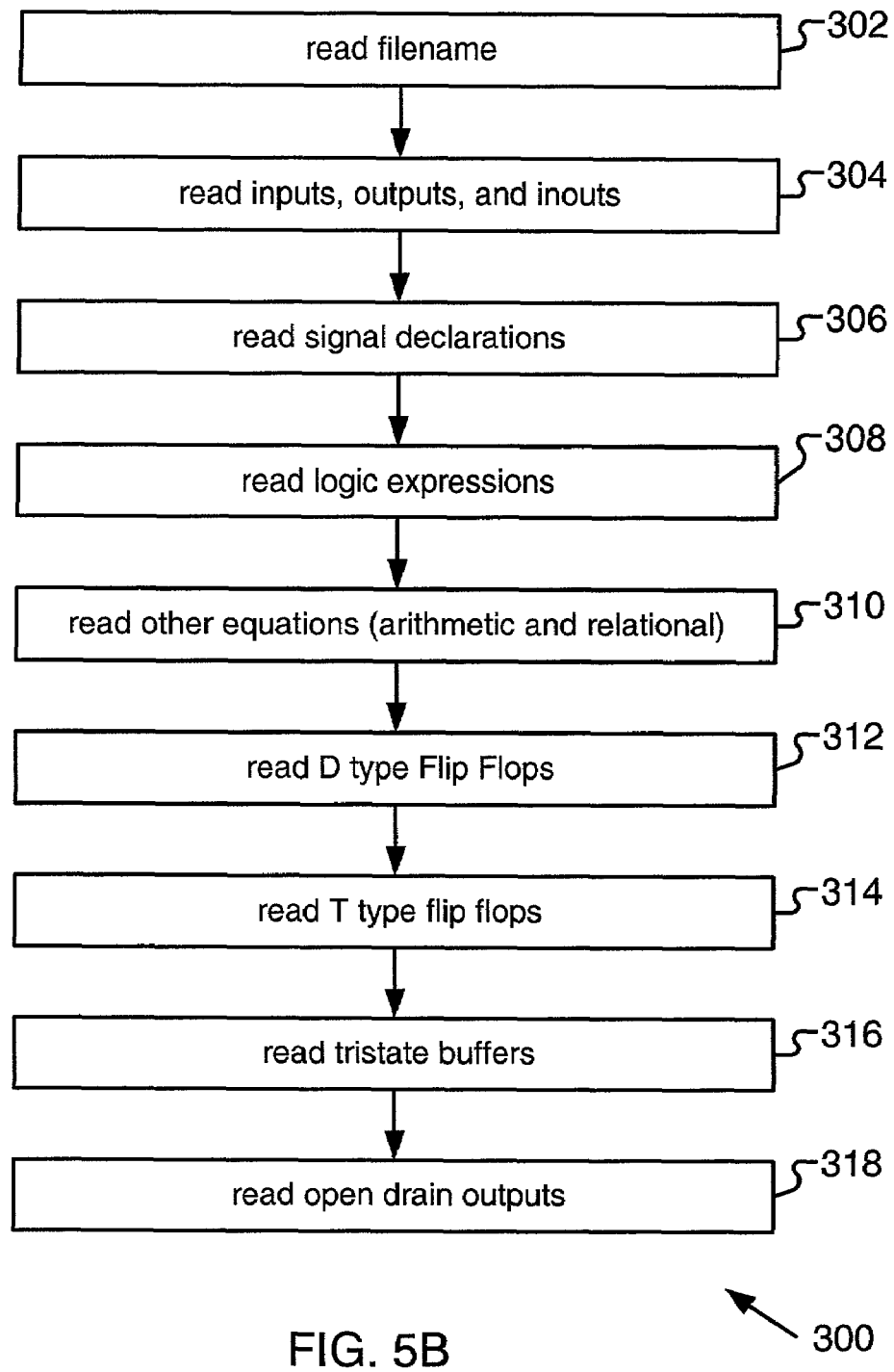
FIG. 5B is a flow chart showing the parsing of logic equations in accordance of the present invention.

FIG. 5B is a flow chart 300 showing the parsing of low level boolean equations in accordance with the present invention. In step 302, the filename of the boolean equations is read. In step 304, the inputs, outputs and inouts are read. In step 306, signal declarations are read. In step 308, logic expressions are read. In step 310, other expressions (arithmetic and relational) are read. In step 312, D-type flip flops are read. In step 314, T type flip flops are read. In step 316, tristate buffers are read. In step 318, open drain outputs are read. The parsing of the boolean equations is completed.

Figure 6A:
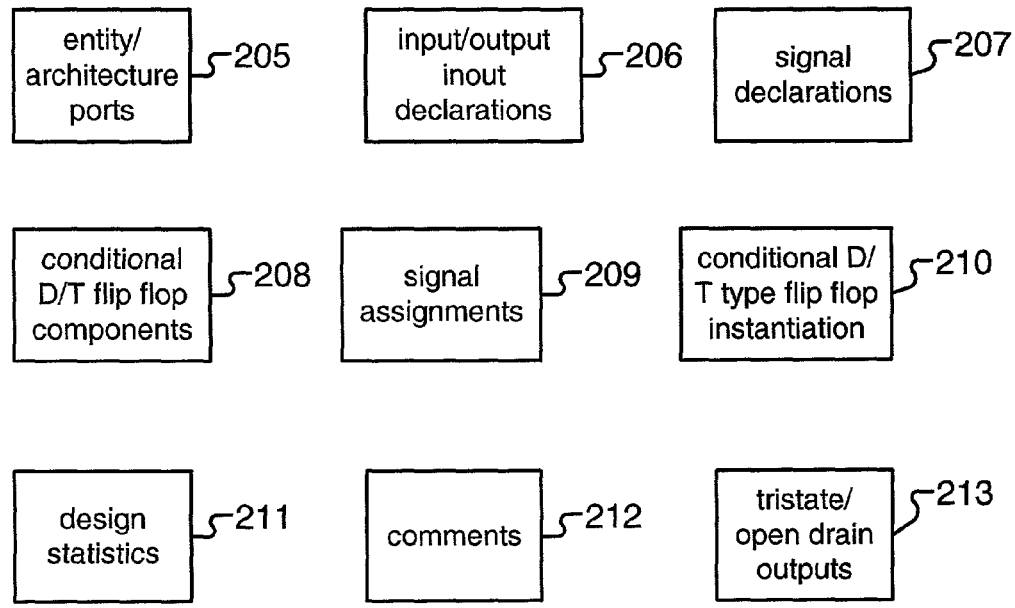
FIG. 6A shows various synthesizable VHDL objects in accordance with the present invention.

FIG. 6A is a diagram showing various synthesizable objects in the synthesizable, editable, and simulatable VHDL language of the present invention. They include entity/architecture ports 205, input/output inout declarations 206, signal declarations 207, conditional D/T flip flop components 208, signal assignments 209, conditional D/T flip flop instantiation 210, design statistics 211, comments 212 and tristate/open drain outputs 213.

Figure 7:
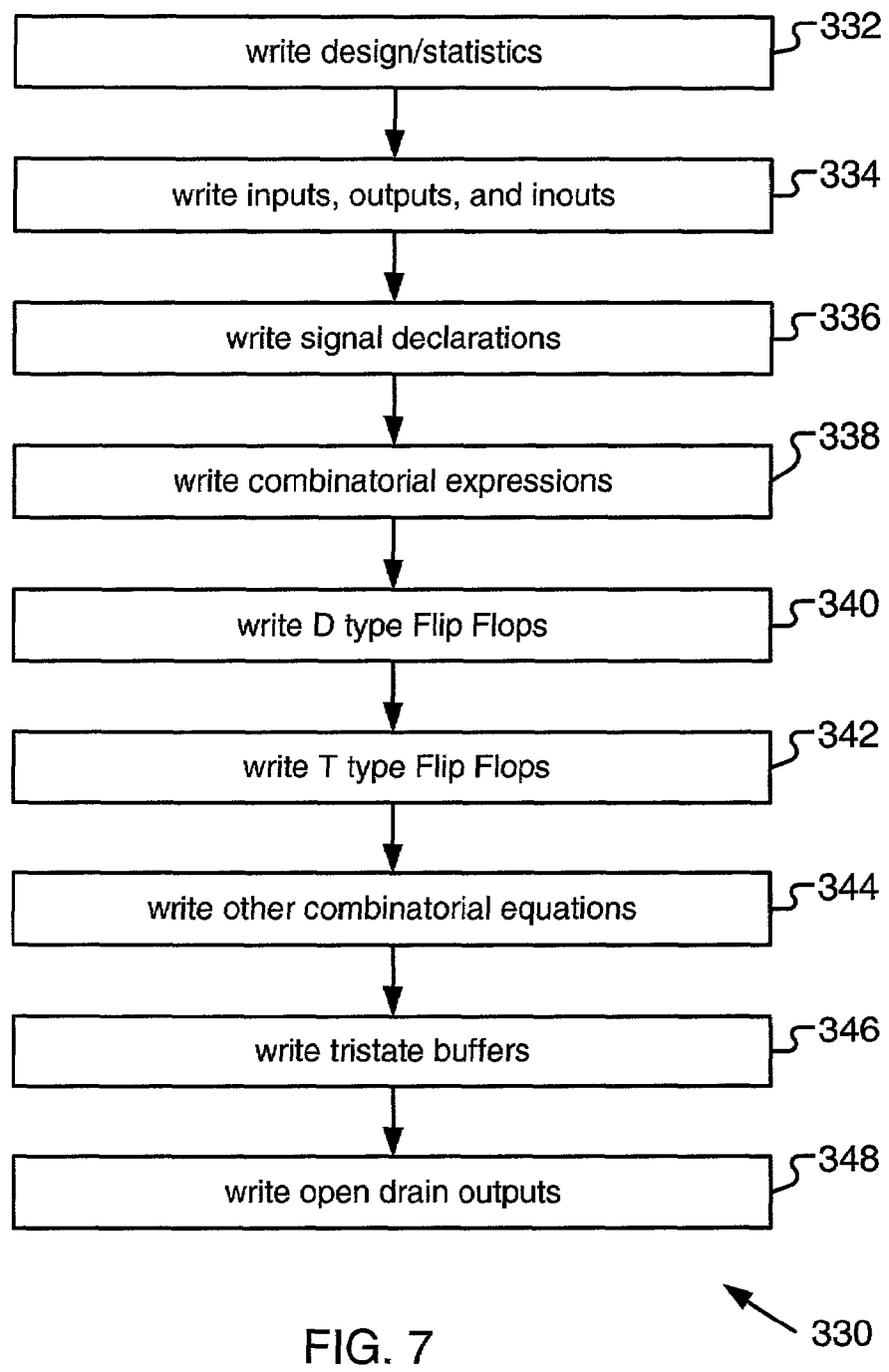
FIG. 7 is flow chart showing the steps for generating a VHDL code of the present invention
Figure 9A:
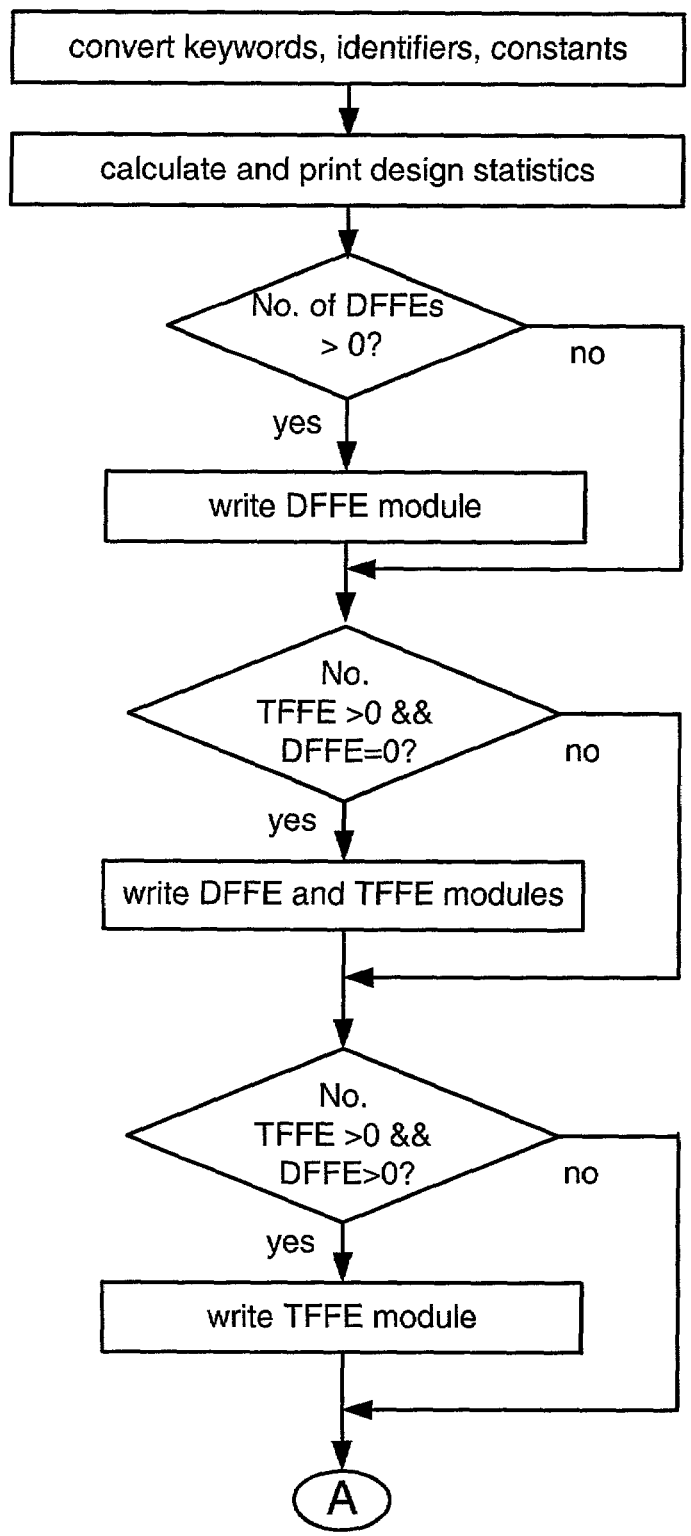
FIGS. 9A-9E, combined, show the steps for generating a Verilog code of the present invention.
Figure 9B:
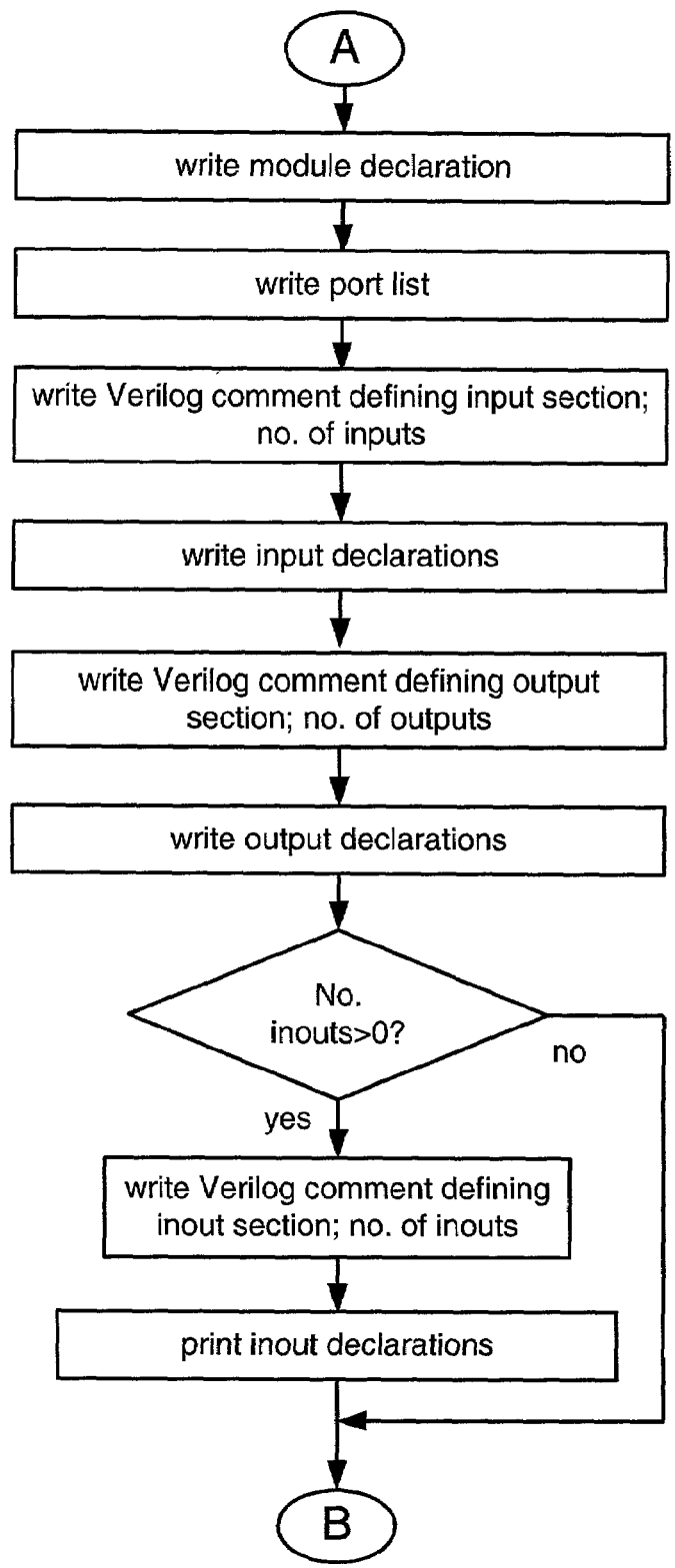
Figure 9C:
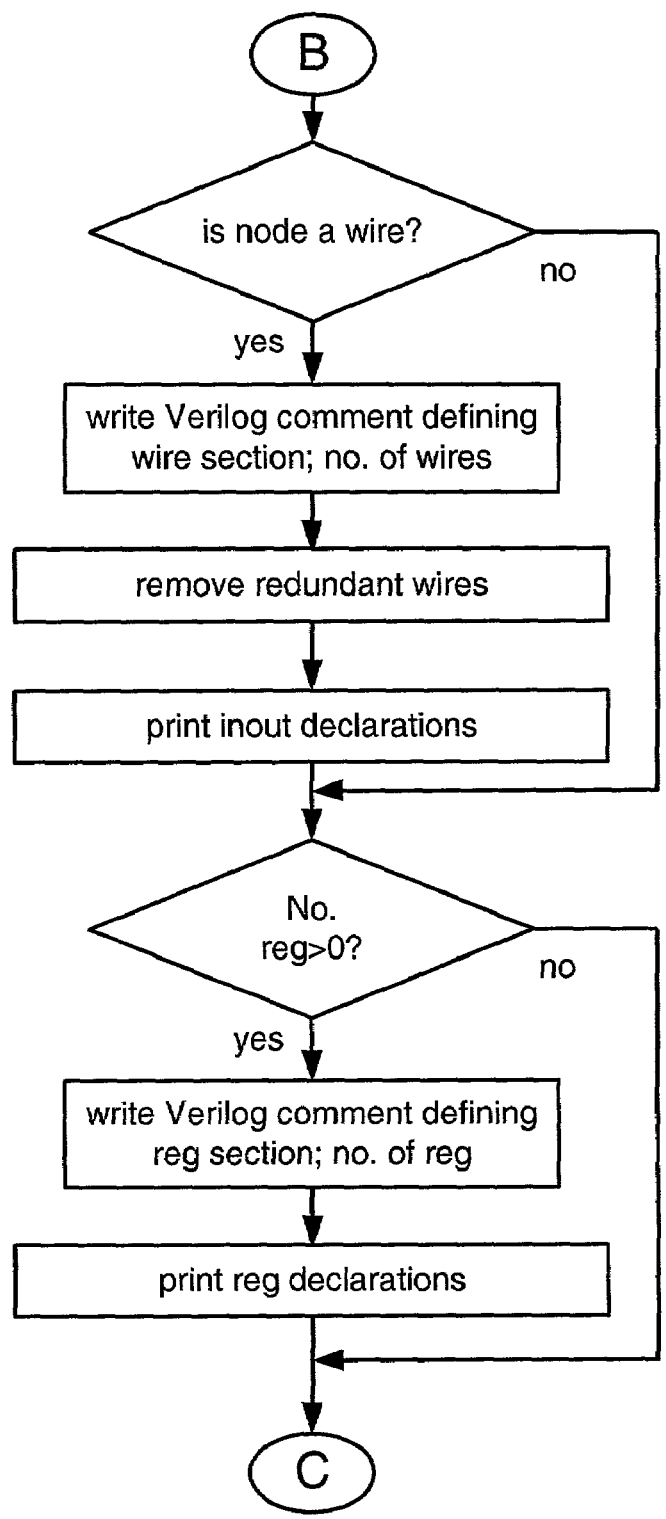
Figure 9D:
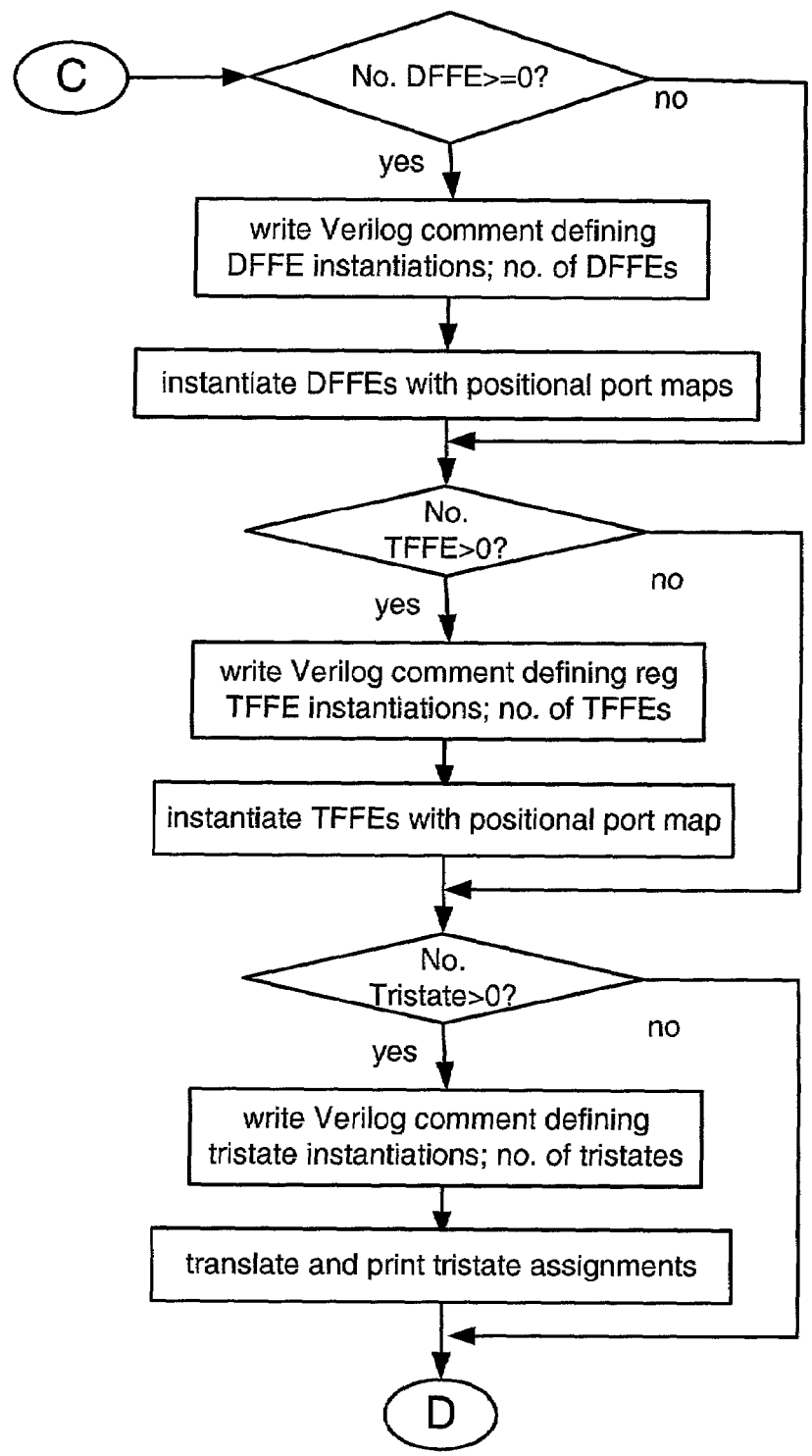
Figure 9E:
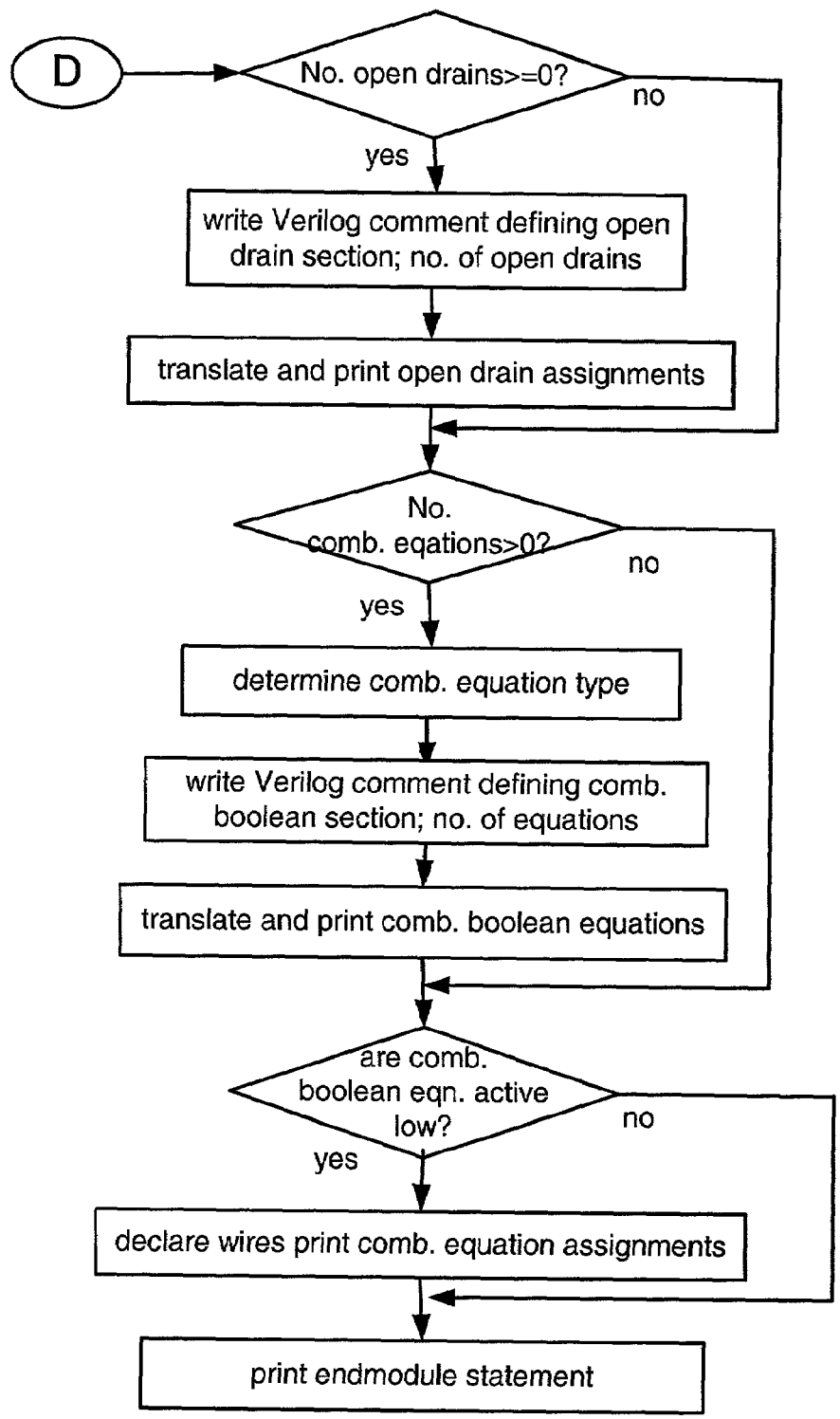

FIG. 7 is flow chart 330 showing the steps for generating VHDL code of the present invention. In step 332, information about design and/or statistics is written. In step 334, the inputs, outputs and inouts are written. In step 336, signal declarations are written. In step 338, combinatorial expressions are written. In step 340, D-type flip flops are written. In step 342, T type flip flops are written. In step 334, other combinatorial expressions are written. In this flow chart, other expressions include expander equations (an architecture specific resource on CPLDs) and equations which contain active low left hand side (LHS) arguments. In step 346, tristate buffers are read. In step 348, open drain outputs are written. The VHDL code is generated.

Figure 1:
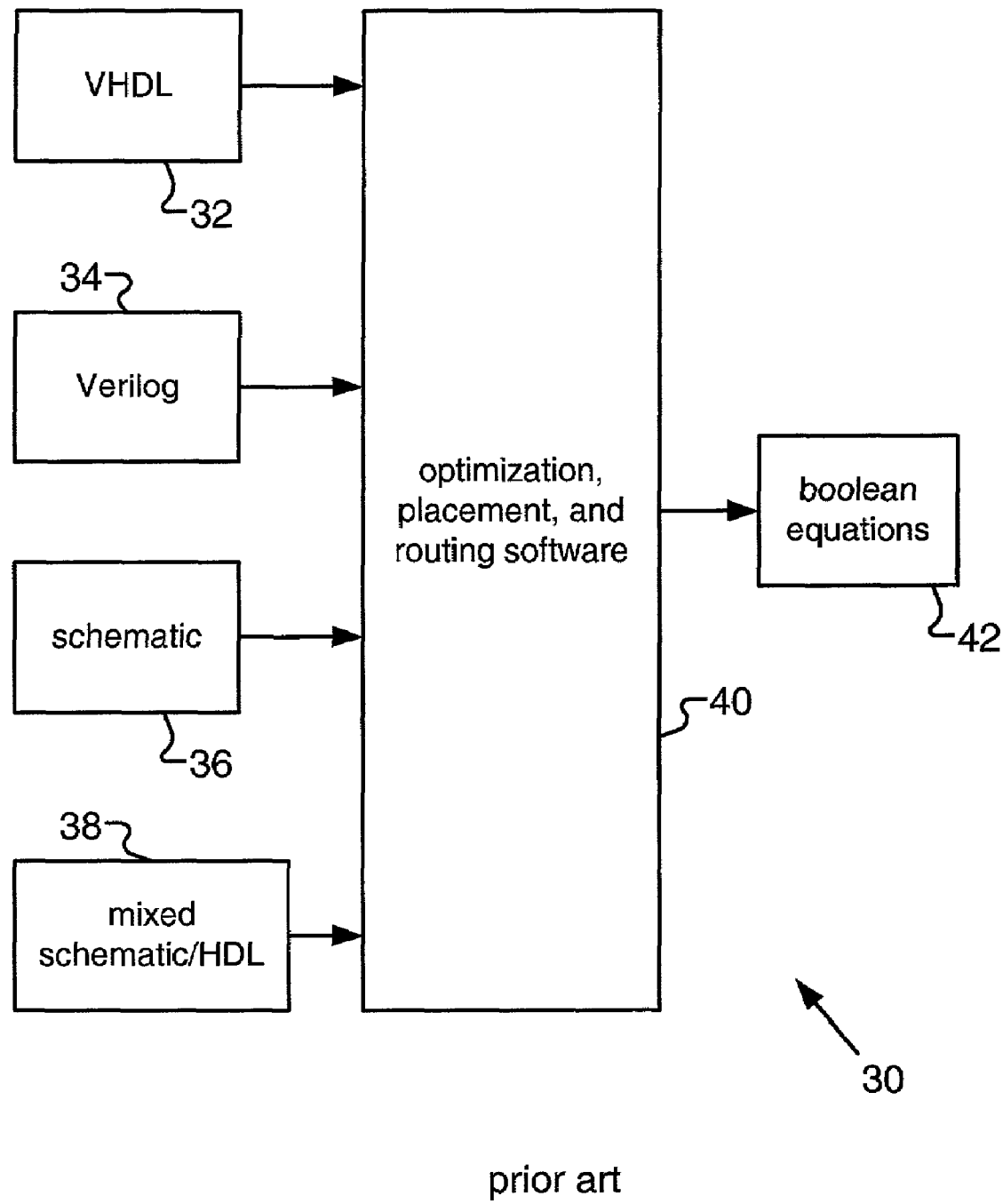
FIG. 1 is a diagram showing a prior art electronic design system.

As an example, a 4-bit counter (described using boolean equations in according with the present invention) is shown in FIG. 8A. FIGS. 8B-1 and 8B-2, in combination, provide the corresponding synthesizable and simulatable VHDL code.

Figure 6B:
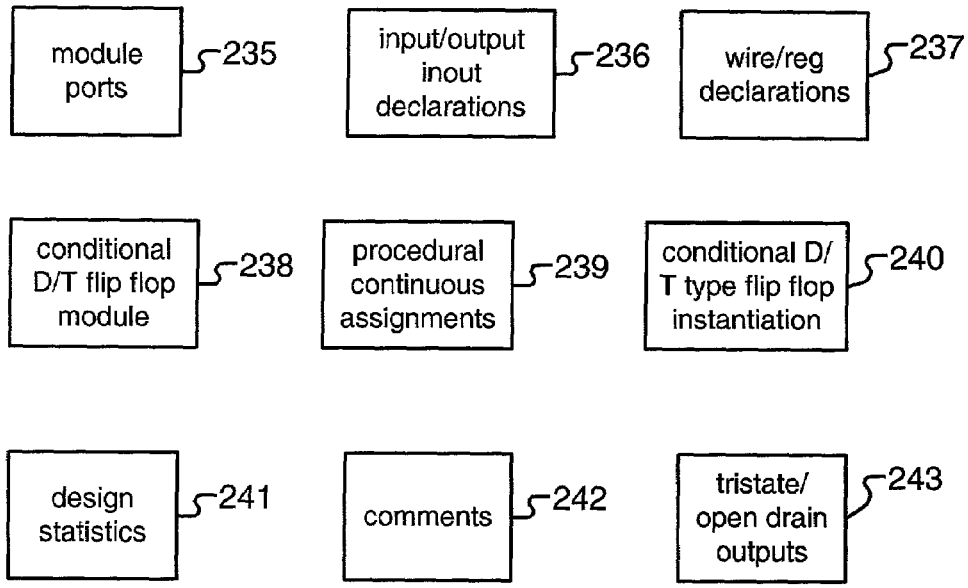
FIG. 6B shows various synthesizable Verilog objects in accordance with the present invention.

The above principle can be applied to Verilog. FIG. 6B is a diagram showing various objects in the synthesizable, editable, and simulatable Verilog language of the present invention. They include module ports 235, input/output inout declarations 236, wire/reg declarations 237, conditional D/T flip flop module 238, procedural continuous assignments 239, conditional D/T flip flop instantiation 240, design statistics 241, comments 242 and tristate/open drain outputs 243.

Steps similar to that illustrated in FIG. 7 may be used to generate Verilog code for a corresponding set of boolean equations. FIGS. 9A-9E, combined, show a flow chart illustrating detailed steps. FIGS. 8C-1 and 8C-2, in combination, show the synthesizable and simulatable Verilog code corresponding to the 4-bit counter of FIG. 8A.

Figure 6C:
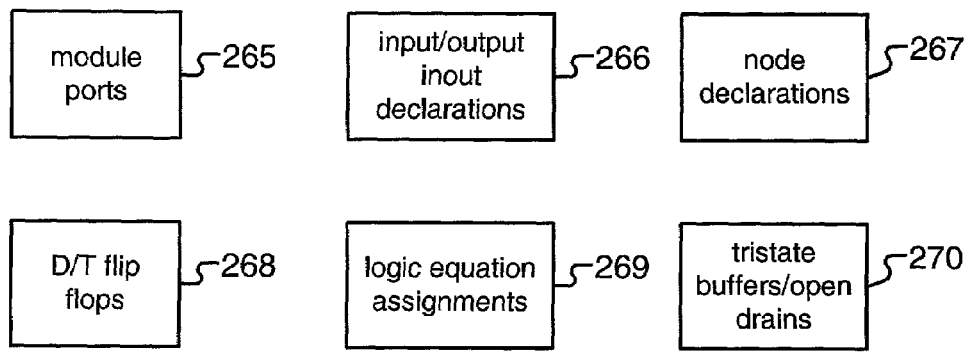
FIG. 6C shows various synthesizable ABEL objects in accordance with the present invention.

The above principle can be applied to ABEL. FIG. 6C is a diagram showing various objects in the synthesizable, editable, and simulatable ABEL language of the present invention. They include module ports 265, input/output inout declarations 266, node declarations 267, D/T flip flops 268, logic equation assignments 269, and tristate/open drain outputs 270.

Steps similar to that illustrated in FIG. 7 may be used to generate ABEL code for a corresponding set of boolean equations. FIG. 8D shows the synthesizable and simulatable ABEL code corresponding to the 4-bit counter of FIG. 8A.

Exemplary listings of programs (written in PERL) that can generate VHDL, Verilog and ABEL codes of the present invention are provided herein as appendix. The listings are recorded on a compact disc as a single text file entitled retarget.txt (created Apr. 22, 2001 and is 84 KB in size). The content of this file is incorporated herein by reference.

While the invention has been particularly shown and described with reference to a preferred embodiment and several alternate embodiments, it will be understood by persons skilled in the relevant art that various changes in form and detail can be made therein without departing from the spirit and scope of the invention.

The invention claimed is:

1. A method for re-targeting a design, said method comprising the steps of:
    receiving a first low-level design representation targeting a first integrated circuit;
    transforming said first low-level design representation into a synthesizable, editable, and simulatable high-level design representation;
    processing said high-level design representation to generate a second low-level design representation targeting a second integrated circuit; and
    wherein said low-level design representation includes Boolean equations and no IF statement, and said high-level representation is a hardware description language (HDL) that has an IF statement.

2. The method of claim 1 wherein one of said first and said second integrated circuits is complex programmable logic device.

3. The method of claim 1 wherein one of said first and said second integrated circuits is field programmable gate array.

4. The method of claim 1 wherein one of said first and said second integrated circuits is gate array.

5. The method of claim 1 wherein one of said first and said second integrated circuits is ASIC.

6. The method of claim 1 wherein said high-level design representation comprises VHDL code.

7. The method of claim 1 wherein said high-level design representation comprises Verilog code.

8. The method of claim 1 wherein said transforming steps comprises the steps of:
    parsing said first low-level design representation;
    identifying equations in said first low-level design representation that give rise to synthesizable and simulatable objects; and
    writing said high-level design representation that contains said synthesizable and simulatable objects.

9. The method of claim 8 wherein said objects include flip flops.

10. The method of claim 8 wherein said objects include input, output and inout.

11. The method of claim 8 wherein said objects include tristate and open drain outputs.

12. The method of claim 8 wherein one of said first and said second integrated circuits is complex programmable logic device.

13. The method of claim 8 wherein one of said first and said second integrated circuits is field programmable gate array.

14. The method of claim 8 wherein one of said first and said second integrated circuits is gate array.

15. The method of claim 8 wherein one of said first and said second integrated circuits is ASIC.

16. The method of claim 8 wherein said high-level design representation comprises VHDL code.

17. The method of claim 8 wherein said high-level design representation comprises Verilog code.

18. A method for re-targeting an electronic circuit design, comprising:
    inputting a first low-level, placed-and-routed design specification targeted to a first type of integrated
    generating from the first design specification, a high-level, synthesizable, and simulatable design specification;
    generating from the high-level design specification a second low-level, placed-and-routed design specification targeted to a second type of integrated circuit, wherein the second type differs from the first type; and
    wherein said low-level design specification includes Boolean equations and no IF statement, and said high-level design specification is a hardware description language (HDL) that has an IF statement.

19. The method of claim 18, wherein the second type of integrated circuit is a complex programmable logic device.

20. The method of claim 18, wherein the second type of integrated circuit is a field programmable gate array.

21. The method of claim 18, wherein the first type of integrated circuit is an ASIC.

22. The method of claim 18, wherein the high-level design specification includes hardware description language code.

23. The method of claim 18, wherein the second low-level design specification includes Boolean equations without IF statements.

24. The method of claim 18, wherein generating the high-level specification comprises:

identifying equations in the first low-level design specification having information for synthesizable and simulatable objects; and writing to the high-level design specification, synthesizable and simulatable objects using the information from the identified equations.

25. An apparatus for re-targeting an electronic circuit design, comprising:

means for inputting a first low-level, placed-and-routed design specification targeted to a first type of integrated means for generating from the first design specification, a high-level, synthesizable, and simulatable design specification;

means for generating from the high-level design specification a second low-level, placed-and-routed design specification targeted to a second type of integrated circuit, wherein the second type differs from the first type; and wherein said low-level design specification includes Boolean equations and no IF statement, and said high-level design specification is a hardware description language (HDL) that has an IF statement.

* * * * *